(12) United States Patent
Han et al.

(10) Patent No.: US 11,387,435 B2
(45) Date of Patent: Jul. 12, 2022

(54) DISPLAY PANEL, MANUFACTURING METHOD THEREOF, AND DISPLAY APPARATUS

(71) Applicant: BOE TECHNOLOGY GROUP CO., LTD., Beijing (CN)

(72) Inventors: Ying Han, Beijing (CN); Jianye Zhang, Beijing (CN); Wei Li, Beijing (CN); Wei Liu, Beijing (CN); Xing Zhang, Beijing (CN); Ning Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 201 days.

(21) Appl. No.: 16/771,841

(22) PCT Filed: May 23, 2019

(86) PCT No.: PCT/CN2019/088113
§ 371 (c)(1),
(2) Date: Jun. 11, 2020

(87) PCT Pub. No.: WO2020/232694
PCT Pub. Date: Nov. 26, 2020

(65) Prior Publication Data
US 2021/0408500 A1    Dec. 30, 2021

(51) Int. Cl.
*H01L 51/52* (2006.01)
*H01L 27/32* (2006.01)
*H01L 51/56* (2006.01)

(52) U.S. Cl.
CPC ........ *H01L 51/5284* (2013.01); *H01L 27/322* (2013.01); *H01L 51/56* (2013.01)

(58) Field of Classification Search
None
See application file for complete search history.

(56) References Cited

U.S. PATENT DOCUMENTS

| 10,545,378 B2 * | 1/2020 | Suzuki ............. G02F 1/133504 |
| 10,902,756 B2 * | 1/2021 | Choi ...................... G09F 9/301 |
| 2003/0062520 A1 | 4/2003 | Toguchi et al. |

(Continued)

FOREIGN PATENT DOCUMENTS

| CN | 1411325 A | 4/2003 |
| CN | 107402473 A | 11/2017 |

(Continued)

OTHER PUBLICATIONS

International Search Report dated Jan. 23, 2020, issued in counterpart Application No. PCT/CN2019/088113 (11 pages).

(Continued)

*Primary Examiner* — J. E. Schoenholtz
(74) *Attorney, Agent, or Firm* — WHDA, LLP

(57) ABSTRACT

The present disclosure is related to a display panel. The display panel may include an emission layer, a colored layer opposite the emission layer, and a grating between the emission layer and the colored layer. The colored layer may include a plurality of color filters and a plurality of black matrixes among the plurality of color filters. Orthographic projection of the grating on the colored layer may fall within orthographic projection of one of the plurality of black matrixes on the colored layer.

20 Claims, 10 Drawing Sheets

(56) References Cited

U.S. PATENT DOCUMENTS

| | | | |
|---|---|---|---|
| 2003/0122487 A1 | 7/2003 | Kwon | |
| 2006/0062270 A1 | 3/2006 | Okutani et al. | |
| 2018/0024404 A1* | 1/2018 | Suzuki | G02F 1/133602 362/84 |
| 2019/0094606 A1 | 3/2019 | Li et al. | |
| 2019/0198573 A1* | 6/2019 | Kim | H01L 27/322 |
| 2019/0302526 A1 | 10/2019 | Tan | |
| 2019/0386077 A1* | 12/2019 | He | H01L 51/5284 |
| 2020/0295097 A1* | 9/2020 | Kikuchi | G02B 5/201 |

FOREIGN PATENT DOCUMENTS

| | | |
|---|---|---|
| CN | 108663858 A | 10/2018 |
| CN | 108761946 A | 11/2018 |
| CN | 109031736 A | 12/2018 |
| CN | 109061948 A | 12/2018 |
| WO | 2019218984 A1 | 11/2019 |

OTHER PUBLICATIONS

Office Action dated Apr. 15, 2022, issued in counterpart CN Application No. 201980000721.3, with English Translation. (15 pages).

\* cited by examiner

Related Art

DISPLAY PANEL, MANUFACTURING METHOD THEREOF, AND DISPLAY APPARATUS

TECHNICAL FIELD

This disclosure relates to display technology, more particularly, to a display panel and a manufacturing method thereof, and a display apparatus.

BACKGROUND

With development of display technology, richness of display color of a display apparatus has gained more and more attention. It is desirable that the display apparatus can display a large range of colors as well as reproduce original color of nature, thereby making viewing effect more lively and natural.

However, due to limitation of color filter material and emission layer (EL) spectrum, the display color gamut is limited. In particular, the current blue-light bandwidth is not narrow enough, and the blue pixel has the greatest influence on the final color gamut.

A white organic light-emitting diode with color filters (WOLED+CF) is a structure often used in large-size OLED technology. This structure has the advantages of high utilization rate of organic EL material, low mask requirement for vapor deposition of EL, and improved aperture ratio by top emission EL. However, the WOLED+CF structure can display a limited color gamut, and has the problem of low display color gamut.

BRIEF SUMMARY

One embodiment of the present disclosure provides a display panel. The display panel may include an emission layer, a colored layer opposite the emission layer, and a grating between the emission layer and the colored layer. The colored layer may include a plurality of color filters and a plurality of black matrixes among the plurality of color filters. Orthographic projection of the grating on the colored layer may fall within orthographic projection of one of the plurality of black matrixes on the colored layer. As such, the portion of white light emitted from the emission layer being incident vertically on the black matrix can be utilized to purify the emission wavelength of pixels such as blue pixels, thereby improving the color gamut.

Another embodiment of the present disclosure provides a method of forming a display panel. The method may include forming an emission layer; forming a grating on a surface of the emission layer, and forming a colored layer opposite the emission layer. The colored layer may include a plurality of color filters and a plurality of black matrixes among the plurality of color filters. The grating may be between the emission layer and the colored layer, and orthographic projection of the grating on the colored layer falls within orthographic projection of one of the plurality of black matrixes on the colored layer.

BRIEF DESCRIPTION OF THE DRAWINGS

The subject matter which is regarded as the disclosure is particularly pointed out and distinctly claimed in the claims at the conclusion of the specification. The foregoing and other objects, features, and advantages of the disclosure are apparent from the following detailed description taken in conjunction with the accompanying drawings in which:

DETAILED DESCRIPTION

Figure 1:
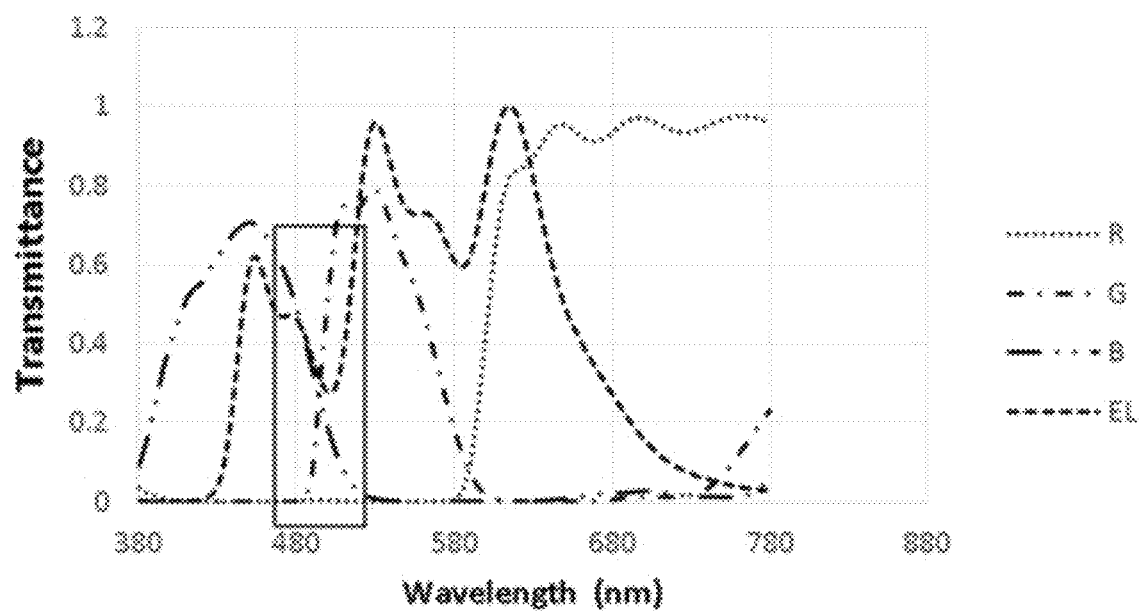
FIG. 1 shows transmittance of white light passing through color filters in a related display panel.

The present disclosure will be described in further detail with reference to the accompanying drawings and embodiments in order to provide a better understanding by those skilled in the art of the technical solutions of the present disclosure. Throughout the description of the disclosure, reference is made to FIGS. 1-11. When referring to the figures, like structures and elements shown throughout are indicated with like reference numerals.

In the description of the specification, references made to the term "one embodiment," "some embodiments," and "exemplary embodiments," "example," and "specific example," or "some examples" and the like are intended to refer that specific features and structures, materials or characteristics described in connection with the embodiment or example that are included in at least some embodiments or example of the present disclosure. The schematic expression of the terms does not necessarily refer to the same embodiment or example. Moreover, the specific features, structures, materials or characteristics described may be included in any suitable manner in any one or more embodiments or examples.

For the purpose of surface description hereinafter, as direction-calibrated in the accompanying drawings, the terms "above", "below", "left", "right", "vertical", "horizontal", "top", "bottom" and derivatives thereof shall relate to the present disclosure. The terms "covers", "on", "positioned on", or "positioned on top of" mean that, for example, a first element of a first structure is on a second element of a second structure, wherein an intermediate element such as an intermediate structure may exist between the first element and the second element. The term "contact" means that, for example, the first element of the first structure and the second element of the second structure are connected directly or indirectly, and other elements may exist or not exist at the interface between the two elements.

In addition, the terms "first" and "second" are for illustration purposes only and are not to be construed as indicating or implying relative importance or implied reference to the quantity of indicated technical features. Thus, features defined by the terms "first" and "second" may explicitly or implicitly include one or more of the features. In the description of the present disclosure, the meaning of "plural" is two or more unless otherwise specifically and specifically defined.

Unless otherwise defined, all the terms (including the technical and scientific terms) used herein have the same meanings as commonly understood by one of ordinary skill in the art to which the present disclosure is directed. It is also understood that the terms such as defined in the usual dictionary should be interpreted as having the same meanings as the meaning in the context of the relevant technology. The terms should not be interpreted as an idealization or as having extreme meanings, unless they are explicitly defined herein. As employed herein, the statement that two or more parts are "connected" or "coupled" together shall mean that the parts are joined together either directly or joined through one or more intermediate parts.

A numerical range modified by "about" herein means that the upper and lower limits of the numerical range can vary by 10% thereof.

In the display mode of WOLED with CF, due to the limitation of the color filter material and EL spectrum, the display color gamut is limited. In particular, purity of blue color is not sufficient. It is very important to improve the display color gamut for the development of display devices.

In a related WOLED display panel, a portion of white light emitted from the EL is incident on the black matrix (BM) vertically. This portion of the white light is blocked by the BM and accordingly not utilized. Furthermore, a main limitation of the display color gamut in the related design of the WOLED display panel is that blue light spectrum is too wide and not sufficiently purified. FIG. 1 shows transmittance of white light passing through color filters in a related WOLED display panel. The color filters include a blue color filter, a green color filter, and a red color filter. In FIG. 1, EL represents the spectrum of white light emitted by the pixel light-emitting layer, and R, G, and B represents the spectra of three pixel color filters of red, green, and blue respectively. As shown in FIG. 1, for the portion of the EL spectrum in the middle of the G and B peaks (about 500 nm or so, enclosed in a line box), the color filter has relatively high transmittance in this area after the white light passes through the color filter. For example, the light of about a wavelength of 480 nm passes through the B color filter, the transmittance of the blue color filter still has a transmittance of about 0.45. Thus, the color filter does not have a significant filtering effect on this area of the light. As shown in FIG. 1, the bandwidth of the B color light is wider. At the area enclosed in the lined box between the peak wavelengths, the wavelengths having the highest energy, of B and G color lights, some of G color light is mixed into the B color light. In other words, the blue color spectrum was not effectively filtered by the blue color filter, thereby resulting in a wider B-bandwidth and a light color, which affects negatively final display color gamut. Eventually, the B color light is not sufficiently purified.

In some embodiments of the present disclosure, by disposing a special phase grating over the EL, the new structural design of the display panel not only utilizes the portion of the white light that was blocked by the BM, but also purify emission wavelength of pixels such as B pixels, thereby improving the color gamut.

Figure 2:
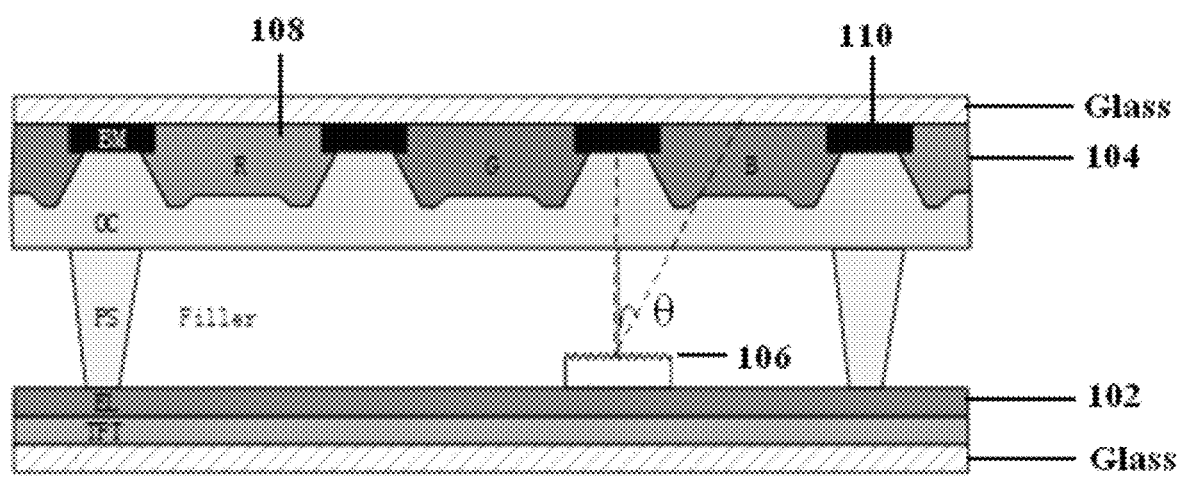
FIG. 2 shows schematic structure of a display panel according to one embodiment of the present disclosure.

Accordingly, FIG. 2 shows a schematic structure of a display panel according to one embodiment of the present disclosure. As shown in FIG. 2, the display panel includes an emission layer (EL) 102, a colored layer 104 opposite the emission layer 102, and a grating 106 between the emission layer 102 and the colored layer 104. The colored layer 104 may include a plurality of color filters 108 and a plurality of black matrixes 110 among the plurality of color filters. The grating may be positioned to be aligned with one of the black matrixes between the color filters.

Figure 3:
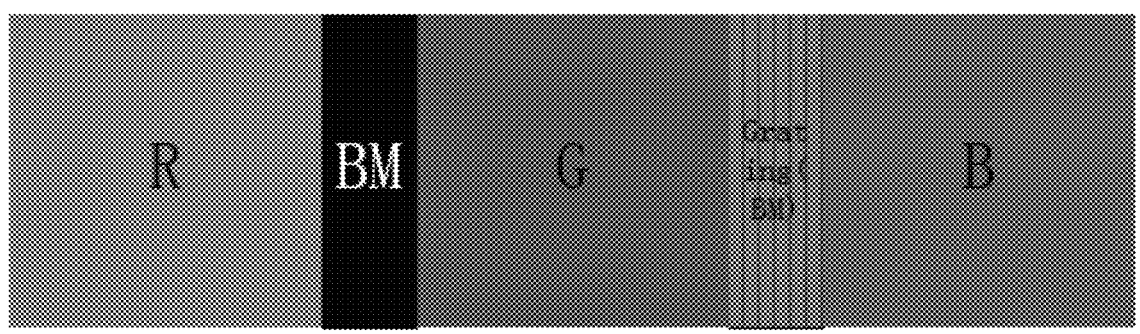
FIG. 3 shows schematic orthographic projection of a grating on a colored layer according to one embodiment of the present disclosure.

FIG. 3 shows schematic orthographic projection of a grating on a colored layer according to one embodiment of the present disclosure. As shown in FIG. 3, orthographic projection of the grating 106 on the colored layer 104 falls within orthographic projection of one of the plurality of black matrixes 110 on the colored layer 104. That is, the grating is disposed at a position aligning with a BM between the color filters. In one embodiment, a width of the grating is the same as a width of the BM between pixels.

In one embodiment, the grating is in direct contact with a surface of the emission layer (EL) facing the colored layer. In one embodiment, the emission layer includes a cathode layer, and the grating is on a surface of the cathode layer facing the colored layer. The emission layer may further include at least one selected from the group consisting of an electron transport layer, an electron injection layer, a light emitting layer, a hole transport layer, and a hole injection layer on a side of the cathode layer opposite from the grating. Furthermore, as shown in FIG. 2, the display panel may further include photo supports (PS) and fillers between the emission layer and the colored layer, and the fillers cover the grating. A thin film transistor (TFT) layer and a glass substrate may be formed on a side of the emission layer opposite from the grating. An optically clear (OC) layer is formed on a side of the colored layer facing the cathode layer.

Figure 4:
FIG. 4 shows a schematic cross-section of a grating according to one embodiment of the present disclosure.

FIG. 4 shows a schematic cross-section of a grating according to one embodiment of the present disclosure. The grating may have a plurality of ridges on its surface. The distance between peaks of two adjacent ridges is defined as a grating period, d. A diffraction grating is an optical component with a periodic structure that splits and diffracts light into several beams travelling in different directions. The directions of these beams depend on the grating period and the wavelength of the light so that the grating acts as the dispersive element. When light is normally incident on the grating, the grating formula is:

$$d \sin \theta = m\lambda$$

Wherein d is the grating period, θ is the diffraction angle, m is the order of diffraction, and λ is the wavelength of light. The wavelength dependence in the grating formula shows that the grating can separate an incident polychromatic beam into its constituent wavelength components, i.e., it is dispersive. The grating may be a transmissive phase grating. In one embodiment, the grating is made of a transparent material. The transparent material may be $SiO_x$. The grating may be formed by a nanoimprinting technique.

Figure 5:
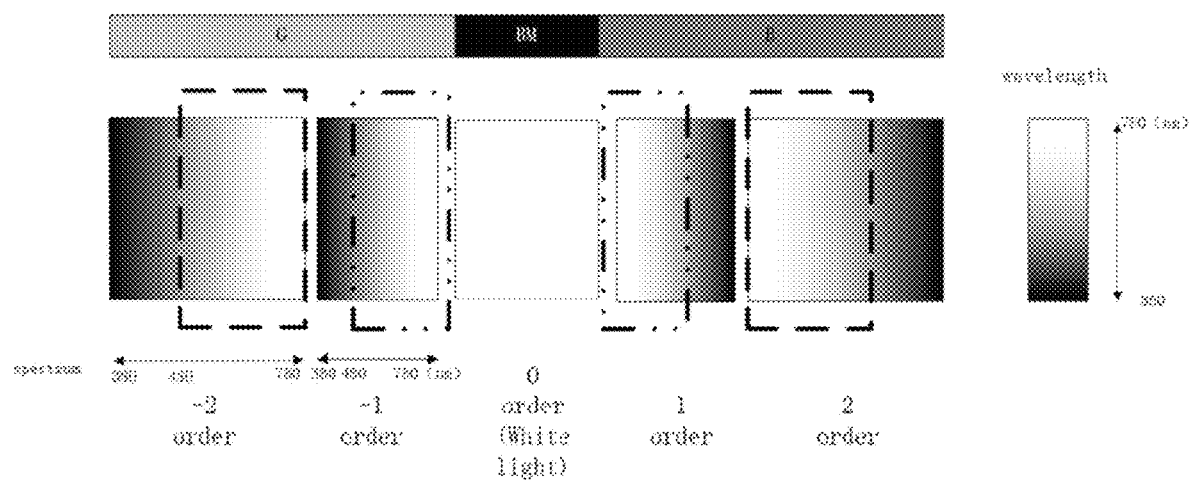
FIG. 5 shows several orders of diffracted light after white light passing through a grating according to one embodiment of the present application.

FIG. 5 shows examples of several orders of diffracted light after white light passes through a grating. When a beam of white light is incident on a grating, the beam of white light is diffracted from the grating in a plurality of directions corresponding to m=−2, −1, 0, 1, 2, 3, etc. wherein m is the order of diffraction. As shown in FIG. 5, each wavelength of input beam spectrum is sent into a different direction, thereby producing a rainbow of colors, for example, in the ±1 orders and ±2 orders of diffracted light under white light illumination. A grating is analogous to a lens. A grating has a 'zero-order mode' (where m=0), in which there is no diffraction and a ray of light behaves according to the laws of reflection and refraction the same as with lens.

In one embodiment of the present disclosure, as shown in FIG. 2, a phase grating is formed at a position between pixels on a surface of EL by, for example, a nanoimprinting technique. The grating is a diffraction screen with periodic spatial structure or periodic optical properties. When the white light that was originally blocked by the BM and accordingly not utilized is incident onto the grating, under joint action of single slit diffraction and interstitial interference, this portion of white light is diffracted into a continuous spectrum to achieve separation of colors, as shown in FIG. 5. The zero order of diffracted spectrum is still incident on the BM and blocked by BM. However, the higher order of diffracted spectrum such as ±1, ±2 orders of spectrum emerges out of the grating at an angle θ and may not be incident on the black matrix as shown in FIG. 2.

In one embodiment, the plurality of color filters in the colored layer, comprises two adjacent color filters. Orthographic projection of the grating on the colored layer falls within orthographic projection of a black matrix between the two adjacent color filters on the colored layer. The grating has a grating period d, and the grating period d is configured according to the grating formula so that one of a first order or a second order of diffracted light by the grating is incident on one of the two adjacent color filters.

In order to reduce the blue light bandwidth and purify blue color light, a grating can be fabricated at the position as shown in FIG. 2. That is, the plurality of color filters comprises a blue filter and an adjacent green or red filter. The orthographic projection of the grating on the colored layer falls within orthographic projection of a black matrix between the blue filter and the adjacent green or red filter on the colored layer. In one embodiment, orthographic projection of a center of the grating on the colored layer coincides with orthographic projection of a center of the black matrix between the blue filter and the adjacent green or red filter on the colored layer. In one embodiment, the orthographic projection of the grating on the colored layer coincides with the orthographic projection of the black matrix between the blue filter and the adjacent green or red filter on the colored layer.

In one embodiment, the grating is formed between the B and R pixels, and the center position of the grating is aligned with the center position of the BM. Therefore, the light that was originally incident on the BM and blocked by the BM is diffracted by the grating. The zero order of the diffracted light is still incident on the BM and blocked by the BM. However, the higher-orders diffraction spectrum is incident onto B and R pixels at both left and right sides.

In this embodiment, the grating period d may be configured according to the grating formula so that one of a first order or a second order of diffracted light by the grating of light emitted by the emission layer is incident on the blue filter. In this embodiment, the 0-order diffracted spectrum by the grating is incident on the BM and blocked by the BM. The position of the ±1, ±2 orders of spectrum is related to the panel thickness and pixel size. In practical applications, the energy of the light emitted by the grating is gradually reduced in the orders of 0, ±1, ±2 . . . . Therefore, the panel thickness and pixel design can be configured to make ±1 and ±2 orders of spectrum out of the grating to be incident on the corresponding pixels while ignoring the higher order of diffracted light.

According to the grating formula, since the diffraction angle |sin θ| cannot be greater than 1, there is a limit regarding the diffraction order and the wavelength of the diffracted light. For example, for a grating with a grating period d=0.96 μm, the light of λ>0.48 um in the second-order spectrum will not be diffracted out of the grating (that is, the light in the dashed line boxes in the second-order spectrum in FIG. 5 will not be diffracted out). In one embodiment, for a grating with d=0.48 um, the light of λ>0.48 um in the first-order spectrum will not be diffracted out of the grating (that is, the light in the dot dashed line boxes in the first-order spectrum in FIG. 5 will not be diffracted out), and the light of λ>0.24 um in the second-order spectrum will not be diffracted out of the grating. In one embodiment of the present disclosure, d is not more than about 1 um. In one embodiment, d is not more than about 0.5 um.

Figure 6:
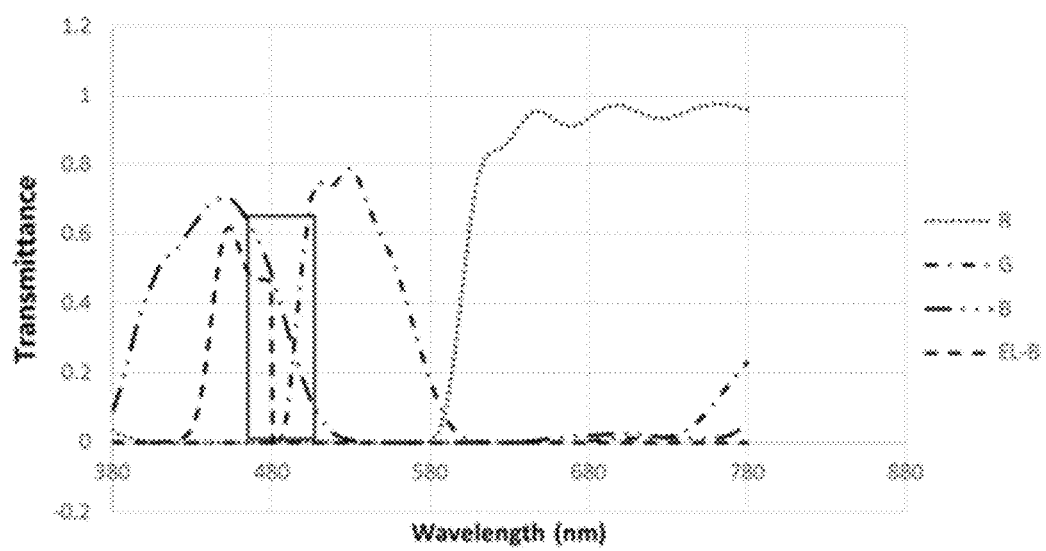
FIG. 6 shows transmittance of white light passing through a grating and color filters according to one embodiment of the present application.

FIG. 6 shows transmittance of white light from the EL passing through a grating and then color filters according to one embodiment of the present application. The color filters may include a blue color filter, a green color filter, and a red color filter. As shown in FIG. 6, after the grating is added, due to the diffraction effect of the grating, the portion of the light emitted by the original EL which is blocked by the BM and not utilized in the related art is diffracted and incident onto the B color filter. The corresponding spectrum is shown as EL-B in FIG. 6. The wavelength of the diffracted light can be controlled by controlling the grating period, such as a grating of d=0.48 um, and the light having a wavelength greater than 0.48 um is filtered out. That is, as shown in FIG. 6, at the area enclosed in a lined box between the peak wavelengths of B and G colors, the light transmittance of greater than 0.48 um is 0, and the full width of the B-light spectrum becomes smaller. Since the light of λ>0.48 um cannot be diffracted out of the grating, there is no G color of light in the diffracted spectrum. That is, there is no G color light mixing into the B color light. As a result, the exiting B color light of the B pixel is purified. Furthermore, the light incident on the G pixel will not affect the emitted light due to the action of the G color filter.

In the embodiment of the present disclosure, a phase grating is utilized. Thus, the portion of white light, which was incident vertically on the black matrix, is diffracted by the grating, and higher orders of diffracted spectrum may be incident onto color filters outside the black matrix. Furthermore, the grating period is configured so that the light of λ>0.48 um cannot be diffracted out of the grating. Thus, the diffracted spectrum can be incident on a blue color filter and accordingly purify the emission wavelength of B pixel, thereby improving the color gamut.

Figure 9:
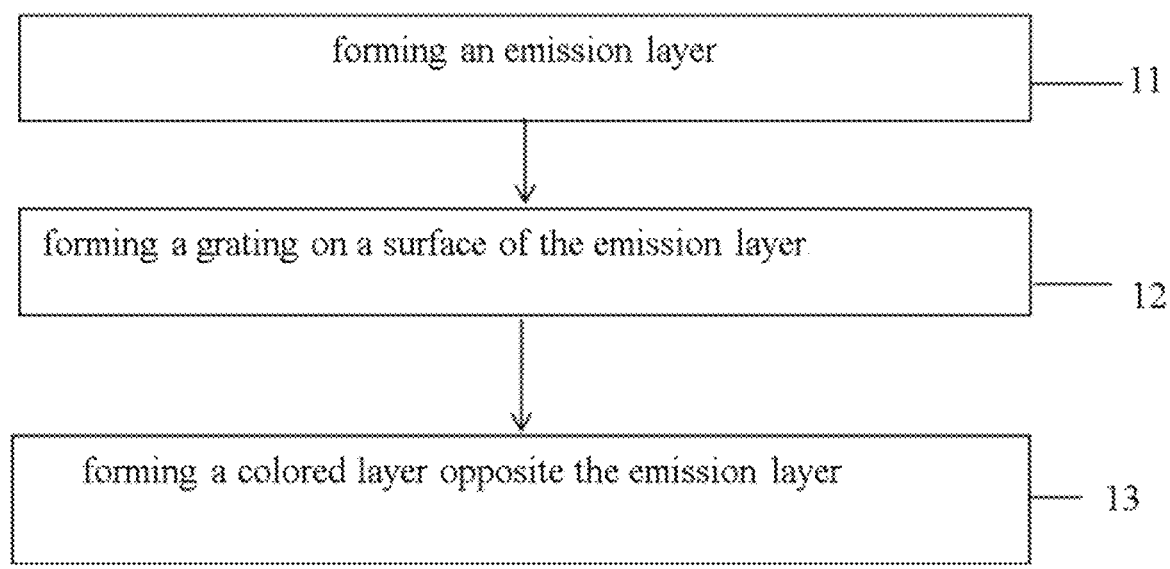
FIG. 9 shows a flowchart of a method of fabricating a display panel according to one embodiment of the present disclosure.

Another example of the present disclosure is a method of forming a display panel. As shown in FIG. 9, the method may include forming an emission layer (step 11), forming a grating on a surface of the emission layer (step 12), and forming a colored layer opposite the emission layer (step 13). The colored layer may include a plurality of color filters and a plurality of black matrixes among the plurality of color filters. The grating is between the emission layer and the colored layer, and orthographic projection of the grating on the colored layer falls within orthographic projection of one of the plurality of black matrixes on the colored layer.

In one embodiment, the grating is fabricated after the cathode is fabricated. The position of the grating is between the G and B pixels, and is aligned with the BM between the G and B pixels, as shown in FIG. 2. This embodiment mainly improves the B light, purifies the B light, thereby improving the color gamut.

Due to the limitation of the wavelength of the filtered light, a high-precision grating is required. The general optical exposure, development, and etching method usually cannot achieve such precision. Therefore, a nanoimprinting technique may be used to fabricate the phase grating as shown in FIG. 4. The nanoimprinting technique can transfer micro and/or nano structure on a stencil to a surface of grating material with an aid of a photoresist. The processing precision of the nanoimprinting technique can reach 2 nm.

Figure 10:
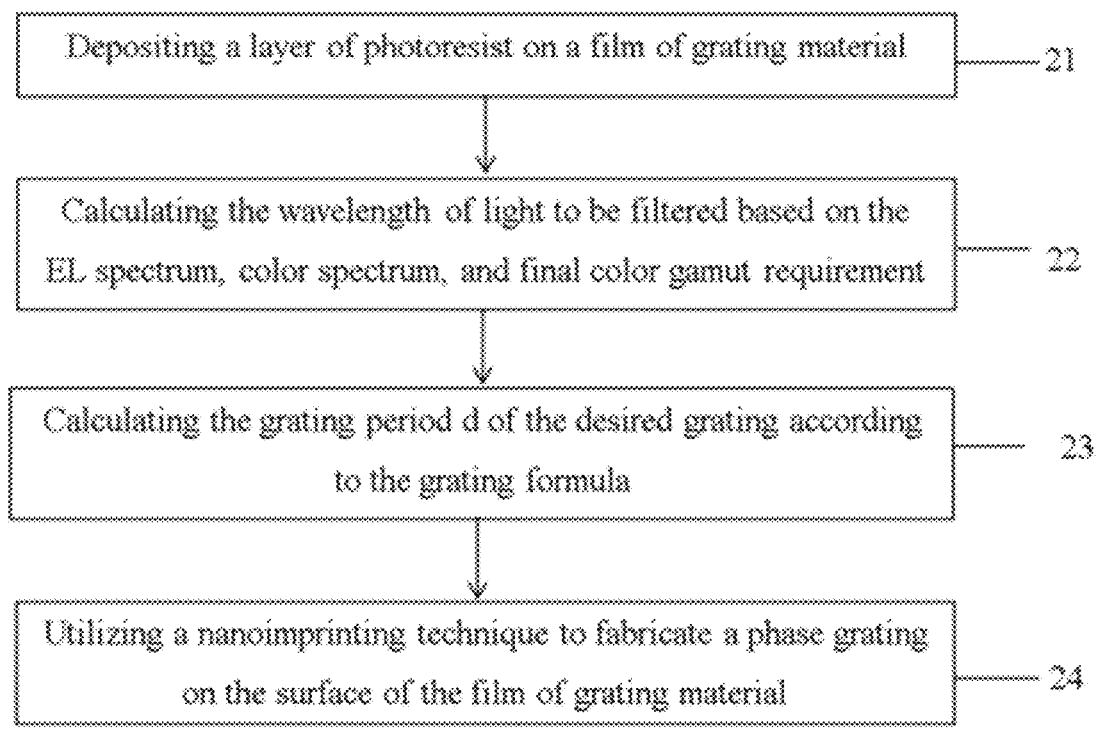
FIG. 10 shows a flowchart of a method of fabricating a grating according to one embodiment of the present disclosure.
Figure 11:
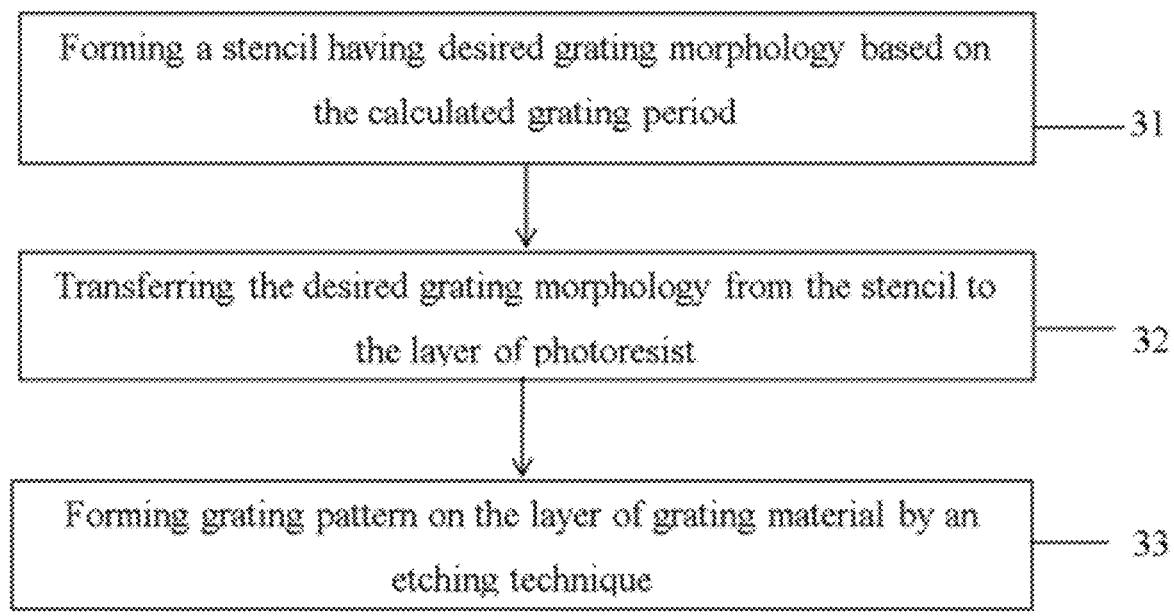
FIG. 11 shows a flowchart of a method of a nanoimprinting technique to fabricate a grating according to one embodiment of the present disclosure.

In one embodiment, as shown in FIG. 10, the method of fabricating a grating includes the following steps 21-24.

In step 21, after a cathode is fabricated, a film of grating material is deposited on a surface of the cathode. The grating material may be $SiO_x$ or other transparent material, which may be deposited by plasma-enhanced chemical vapor deposition (PECVD). Then, a layer of photoresist is applied onto the surface of the film of grating material for pattern transfer.

In step 22, the wavelength of light to be filtered is calculated based on the EL spectrum, color spectrum, and final color gamut requirement.

In step 23, the grating period d of the desired grating is calculated according to the grating formula.

In step 24, a nanoimprinting technique is utilized to fabricate a phase grating on the surface of the film of grating material.

Figure 7:
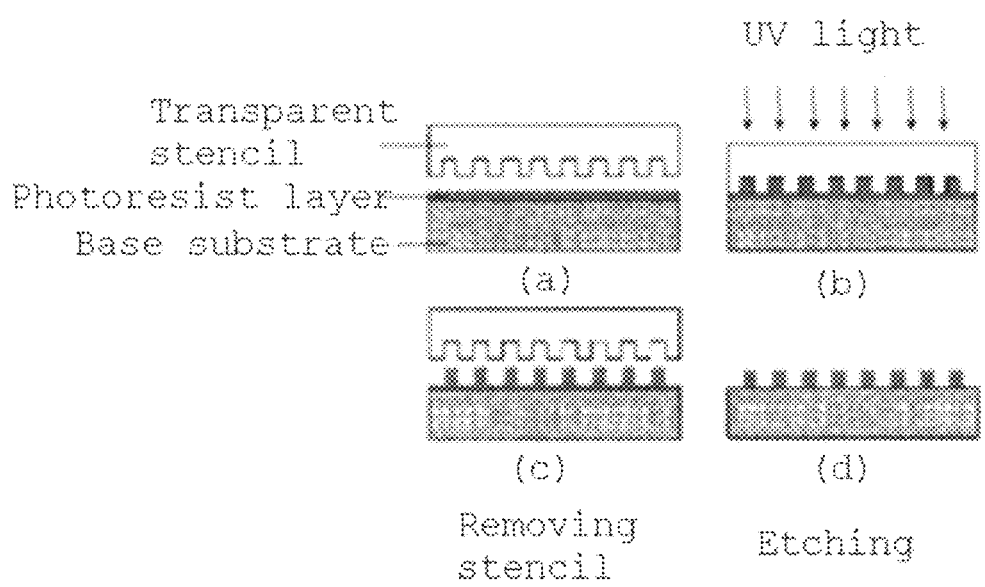
FIG. 7 shows schematic diagrams of a method of fabricating a grating according to one embodiment of present disclosure.

FIG. 7 shows schematic diagrams of a method of fabricating a grating by a nanoimprinting technique according to one embodiment of present disclosure. In one embodiment, referring to FIG. 11, using the nanoimprinting technique to fabricate a phase grating may include the following steps 31-33.

In step 31, a stencil having desired grating morphology is first formed based on the calculated grating period. An electron beam etching technique or the like can be used to form the desired grating morphology on silicon or other substrate as the stencil.

In step 32, as shown in FIGS. 7(a)-(c), the desired grating morphology is transferred to the layer of photoresist. In one embodiment, the stencil is first pressed onto the layer of photoresist coated on the film of grating material. Then, UV light is used to irradiate the layer of photoresist. After the photoresist is cured, the stencil is separated from the film of grating material. As a result, the desired grating morphology is formed in the layer of photoresist.

In step 33, as shown in FIG. 7(d), a grating pattern is formed on they layer of grating material by an etching technique such as dry etching. The layer of photoresist with the desired grating morphology is used as a mask during the etching process. After the etching, the layer of photoresist is removed. As such, a high-precision phase grating with the desired grating morphology is formed in the film of grating material.

Figure 8:
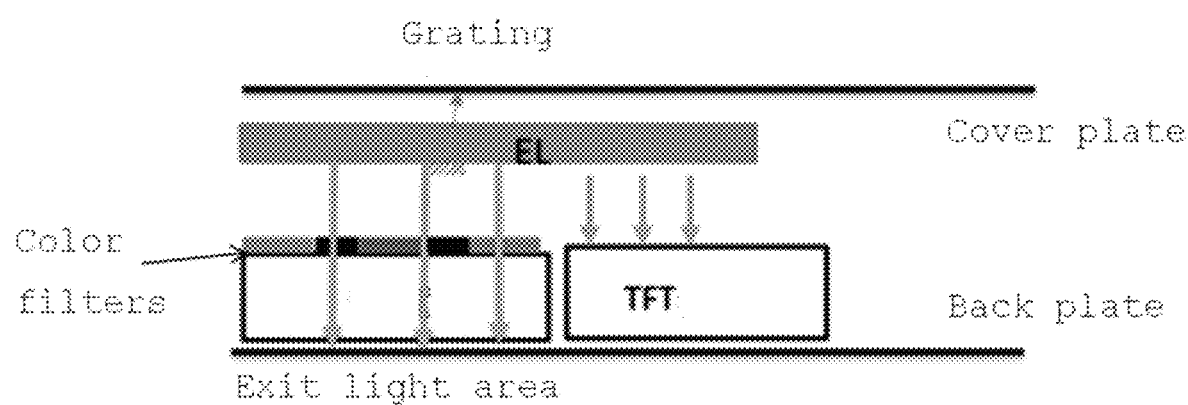
FIG. 8 shows schematic structure of a bottom emission display panel according to one embodiment of the present disclosure.

The main limitation of the display color gamut in the related design is that blue light spectrum is too wide and not sufficiently purified. Therefore, in some embodiments of the present disclosure, gratings are formed between B and G pixels to improve B-light. In practice, any pixel in the panel can be improved. It is only necessary to make gratings of different grating periods according to the wavelength of light to be filtered. At the same time, this scheme can also be applied to a bottom emitting device, as shown in FIG. 8. FIG. 8 shows schematic structure of a bottom emission display panel according to one embodiment of the present disclosure. As shown in FIG. 8, the grating is disposed between the EL and the colored layer in a light exiting area. The colored layer includes a plurality of color filters and a plurality of black matrixes among the plurality of color filters. The grating may be positioned to be aligned with one of the black matrixes between the color filters.

Another example of the present disclosure is a display apparatus. The display apparatus includes the display panel according to one embodiment of the present disclosure. The display apparatus may be a top emission WOLED apparatus or a bottom emission WOLED apparatus.

The principle and the embodiment of the disclosure are set forth in the specification. The description of the embodiments of the present disclosure is only used to help understand the method of the present disclosure and the core idea thereof. Meanwhile, for a person of ordinary skill in the art, the disclosure relates to the scope of the disclosure, and the technical embodiment is not limited to the specific combination of the technical features, and also should covered other technical embodiments which are formed by combining the technical features or the equivalent features of the technical features without departing from the inventive concept. For example, technical embodiments may be obtained by replacing the features described above as disclosed in this disclosure (but not limited to) with similar feature.

What is claimed is:

1. A display panel, comprising:
   an emission layer;
   a colored layer opposite the emission layer, the colored layer comprising a plurality of color filters and a plurality of black matrixes among the plurality of color filters; and
   a grating between the emission layer and the colored layer;
   wherein orthographic projection of the grating on the colored layer falls within orthographic projection of one of the plurality of black matrixes on the colored layer.

2. The display panel of claim 1, wherein the grating is in direct contact with a surface of the emission layer facing the colored layer.

3. The display panel of claim 1, wherein the plurality of color filters comprises a blue filter and an adjacent green or red filter and the orthographic projection of the grating on the colored layer falls within orthographic projection of a black matrix between the blue filter and the adjacent green or red filter on the colored layer.

4. The display panel of claim 3, wherein orthographic projection of a center of the grating on the colored layer coincides with orthographic projection of a center of the black matrix between the blue filter and the adjacent green or red filter on the colored layer.

5. The display panel of claim 4, wherein the orthographic projection of the grating on the colored layer coincides with the orthographic projection of the black matrix between the blue filter and the adjacent green or red filter on the colored layer.

6. The display panel of claim 1, wherein the grating has a grating period d, and the grating period d is configured so that when white light emitted by the emission layer is vertically incident on the grating, light of $\lambda > 0.48$ um cannot be diffracted out in a first order or a second order of diffracted light by the grating.

7. The display panel of claim 6, wherein d is not more than about 1 um, and light of $\lambda > 0.48$ um cannot be diffracted out in a second order of diffracted light by the grating.

8. The display panel of claim 6, wherein d is not more than about 0.5 um, and light of $\lambda>0.48$ um cannot be diffracted out in a first order of diffracted light by the grating.

9. The display panel of claim 1, wherein the grating is made of a transparent material.

10. The display panel of claim 9, wherein the transparent material is $SiO_x$.

11. The display panel of claim 1, wherein the grating is formed by a nanoprinting technique.

12. The display panel of claim 1, wherein the emission layer comprises a cathode layer, and the grating is on a surface of the cathode layer facing the colored layer.

13. The display panel of claim 1, further comprising fillers between the emission layer and the colored layer, and the fillers covers the grating.

14. A display apparatus, comprising the display panel according to claim 1.

15. The display apparatus of claim 14, wherein the display apparatus is a top emission WOLED apparatus or a bottom emission WOLED apparatus.

16. A method of forming a display panel, the method comprising:
forming an emission layer;
forming a grating on a surface of the emission layer; and
forming a colored layer opposite the emission layer, the colored layer comprising a plurality of color filters and a plurality of black matrixes among the plurality of color filters;
wherein the grating is between the emission layer and the colored layer, and orthographic projection of the grating on the colored layer falls within orthographic projection of one of the plurality of black matrixes on the colored layer.

17. The method of forming the display panel of claim 16, wherein forming the grating on the surface of the emission layer comprises:
depositing a film of a grating material on the surface of the emission layer;
depositing a layer of a photoresist on the film of the grating material;
forming a desired grating morphology on the layer of photoresist; and
forming the grating with the desired grating morphology on the film of the grating material by a nanoimprinting technique.

18. The method of forming the display panel of claim 16, wherein the emission layer comprises a cathode layer, and the grating is formed on a surface of the cathode layer facing the colored layer.

19. The method of forming the display panel of claim 18, wherein the plurality of color filters comprises a blue filter and an adjacent green or red filter and the orthographic projection of the grating on the colored layer falls within orthographic projection of a black matrix between the blue filter and the adjacent green or red filter on the colored layer.

20. The method of forming the display panel of claim 16, wherein the grating has a grating period d, and the grating period d is configured so that when white light emitted by the emission layer is vertically incident on the grating, light of $\lambda>0.48$ um cannot be diffracted out in a first order or a second order of diffracted light by the grating.

* * * * *